United States Patent
Sommer et al.

(10) Patent No.: US 7,154,793 B2
(45) Date of Patent: Dec. 26, 2006

(54) INTEGRATED MEMORY AND METHOD FOR FUNCTIONAL TESTING OF THE INTEGRATED MEMORY

(75) Inventors: Michael Bernhard Sommer, Raubling (DE); Fabien Funfrock, München (DE)

(73) Assignee: Infineon Technologies AG, Munich (DE)

( * ) Notice: Subject to any disclaimer, the term of this patent is extended or adjusted under 35 U.S.C. 154(b) by 116 days.

(21) Appl. No.: 10/948,562

(22) Filed: Sep. 24, 2004

(65) Prior Publication Data

US 2005/0068841 A1    Mar. 31, 2005

(30) Foreign Application Priority Data

Sep. 26, 2003    (DE)    ............................... 103 44 879

(51) Int. Cl.
*G11C 29/06*    (2006.01)
(52) U.S. Cl. .................. 365/201; 365/69; 365/230.03
(58) Field of Classification Search .................. 365/69, 365/190, 201, 230.03
See application file for complete search history.

(56) References Cited

U.S. PATENT DOCUMENTS

| | | | | |
|---|---|---|---|---|
| 4,860,259 A | | 8/1989 | Tobita | |
| 5,029,330 A | * | 7/1991 | Kajigaya | 365/201 |
| 5,305,265 A | * | 4/1994 | Sugibayashi | 365/194 |
| 5,367,492 A | * | 11/1994 | Kawamoto et al. | 365/201 |
| 5,461,589 A | | 10/1995 | Hidaka et al. | |
| 5,726,939 A | * | 3/1998 | Cho et al. | 365/201 |
| 6,041,002 A | * | 3/2000 | Maejima | 365/201 |
| 6,574,128 B1 | * | 6/2003 | Morgan | 365/72 |

* cited by examiner

*Primary Examiner*—Tan T. Nguyen
(74) *Attorney, Agent, or Firm*—Edell, Shapiro & Finnan, LLC

(57) ABSTRACT

An integrated memory includes memory cells arranged in a memory cell array along word lines and bit lines. One of the bit lines can be connected to a data line by a respective one of a plurality of switches. The memory contains column select lines. One of the column select lines in each case connected to a plurality of the switches for driving, in an activated state, in order to connect a number of bit lines to a same number of data lines. An access controller is connected to the column select lines and can be operated in a test operating mode such that a plurality of the column select lines are activated in the event of a memory cell access. The writing of test data to the memory cell array in a test operating mode can thus be optimized in accordance with the invention.

11 Claims, 3 Drawing Sheets

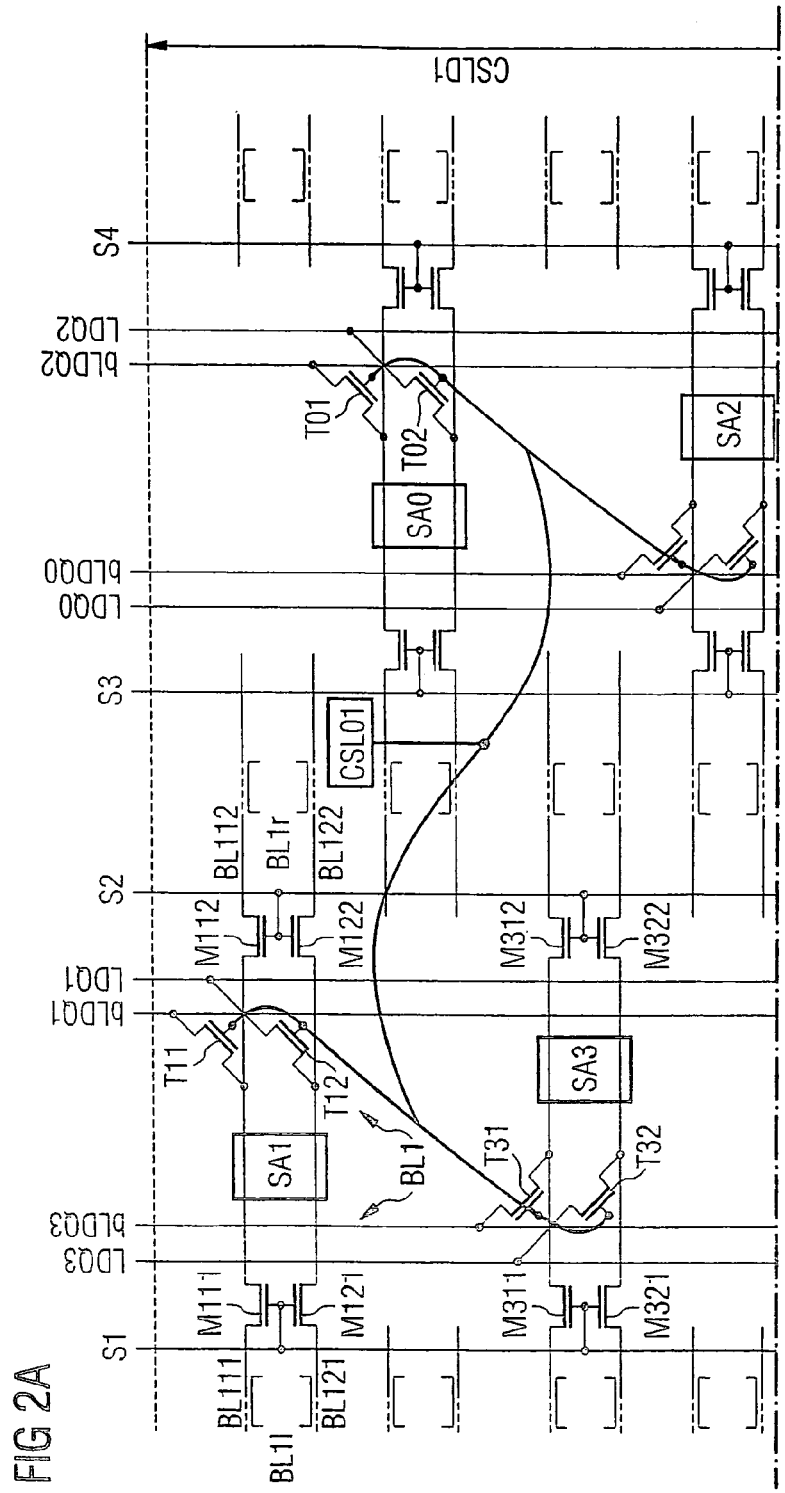

INTEGRATED MEMORY AND METHOD FOR FUNCTIONAL TESTING OF THE INTEGRATED MEMORY

CROSS REFERENCE TO RELATED APPLICATIONS

This application claims priority under 35 USC §119 to German Application No. DE 103 44 879.9, filed on Sep. 26, 2003, and titled "Integrated Memory and Method for Functional Testing of the Integrated Memory," the entire contents of which are hereby incorporated by reference.

FIELD OF THE INVENTION

The present invention relates to an integrated memory and to a method for functional testing of the integrated memory.

BACKGROUND

Integrated memories, for example, in the form of DRAMs (Dynamic Random Access Memories), are generally subject to comprehensive functional tests in the fabrication process. Inter alia, the functional tests serve for identifying defective memory cells or defective column lines or row lines. As the memory size increases, the costs of functional tests make up an ever greater proportion of the overall production costs of a memory. In order to lower the test costs, therefore, methods such as test modes for compressing data or additional test logic, for example, in the form of BIST (Built-In Self-Test), are increasingly being developed.

Integrated memories generally have redundant memory cells for repairing defective memory cells. The redundant memory cells are usually combined to form redundant row lines or redundant column lines that can replace regular lines having defective memory cells in address terms. As a result, it is possible for integrated memories, in particular, in the form of DRAMs, to be fabricated economically with the integration densities that are achieved nowadays. An integrated memory is tested, for example, by an external test device and a programming of redundant elements is subsequently performed based on a redundancy analysis. In order to be able to carry out a repair of a memory in a targeted manner, it is necessary, in corresponding tests or test sequences, to identify all defects and store them together with the associated address on the external test system. For this purpose, the addresses of those tested memory cells which have been detected as defective are stored in a defect address memory, i.e., Fail Bit Map, in order to replace these memory cells by defect-free redundant memory cells in a subsequent step based on stored addresses. The repair solution specific to each memory can subsequently be calculated in the test system based on the fail bit map.

In order to minimize the test costs per memory chip, the memory chips are increasingly tested in parallel. This trend is supplemented by the increasing use of test circuits that are provided on the memory chip, such as, for example, circuits for carrying out BIST or compressing test modes. Such circuits support an externally connected test unit for functional testing of the memory chip and thereby reduce the test cycle times without a new, more complex tester equipment having to be used for this purpose. With the use of a BIST, the test control (i.e., address and data generation, command sequence) is generally effected completely in the memory chip. However, the test cycle times are furthermore primarily limited by the fact that the calculation of the repair solution upon establishing functional defects in the memory chip still has to be effected externally. Therefore, it is necessary to transmit the defect data to an external unit even in the case of a BIST-based test cycle. The external unit receives the defect data and calculating a repair solution therefrom.

An integrated memory and a method for functional testing of an integrated memory by which to accelerate a test cycle for functional testing of the memory, are desirable.

SUMMARY

An integrated memory according to the invention has memory cells arranged in a memory cell array along word lines for selection of the memory cells and bit lines for reading out or writing data signals of the memory cells. Furthermore, a plurality of switches are provided. One of the bit lines connected to a data line by a respective one of the switches. The memory has column select lines. One of the column select lines connected to a plurality of the switches for driving the latter in an activated state in order to connect a number of bit lines to a same number of data lines. An access controller is connected to the column select lines and can be operated in a test operating mode such that a plurality of the column select lines can be activated in the event of a memory cell access.

Remaining optimization potential for accelerating a test cycle for functional testing of an integrated memory used. Writing test data to the memory cell array can be optimized by a modified access controller in a test operating mode. In this case, during a typical functional test of an integrated memory, under specific conditions, an identical data pattern is written repeatedly to the memory cell array in order to subsequently, during a read process during which the written-in test data are read out from the memory cell array, be able to assess the quality of the memory cells. With the simultaneous activation of a plurality of the column select lines by the access controller in the event of a memory cell access, test data can be written to the memory cell array more rapidly since it is made possible to connect a plurality of bit lines to an envisaged number of data lines in order to be able to write test data to a plurality of memory cells.

In accordance with one embodiment of the present invention, sense amplifiers for evaluating and amplifying data signals of the memory cells are provided and can be connected to a respective bit line. A plurality of sense amplifiers are arranged in a respective sense amplifier strip. The data lines are assigned to one of the sense amplifier strips. The access controller can be operated such that the data lines assigned to a sense amplifier strip are connected to corresponding bit lines by one of the column select lines. With activation of a plurality of the column select lines, test data are written not only to a number of bit lines corresponding to the number of data lines, but also to a multiple thereof. For example, with the simultaneous activation of two column select lines, double the number of bit lines are connected to the data lines via the sense amplifier strip. This is possible in the test operation, in contrast to a normal operation of the memory in which groups of bit lines are written to one after the other by a time-intensive burst, since typically identical data patterns for functional testing of the memory cells are written to the memory cell array.

In another embodiment of the invention, the bit lines are subdivided into two partial regions by a sense amplifier strip. The partial regions of one of the bit lines are connected to one of the sense amplifiers of the sense amplifier strip via an isolation switch. In order to further shorten the time for writing to the memory cell array, the isolation switches can be driven by the access controller such that the partial regions of one of the bit lines can be relatively simultaneously connected to the sense amplifier of the sense amplifier strip. Consequently, in the event of word lines being activated correspondingly in parallel, test data are simultaneously written to a region of the memory cell array arranged on the left and on the right of the sense amplifier strip.

In another embodiment of the invention, the memory cell array is subdivided into a plurality of regions of the same type. A crossing location of the bit lines is provided between the regions. At the crossing location, the bit lines of one of the regions of the memory cell array cross with the bit lines of another of the regions of the memory cell array. Given such a design of the memory cell array, in the event of simultaneous activation of a plurality of column select lines, a targeted geometrically distributed data pattern can be generated, so that it is possible to produce different data topologies.

BRIEF DESCRIPTION OF THE FIGURES

The invention is explained in more detail below with reference to the figures illustrated in the drawing, which illustrate exemplary embodiments of the present invention.

FIGS. 2A and 2B show an embodiment of an integrated memory according to the invention illustrated in excerpts.

DETAILED DESCRIPTION

Figure 1:
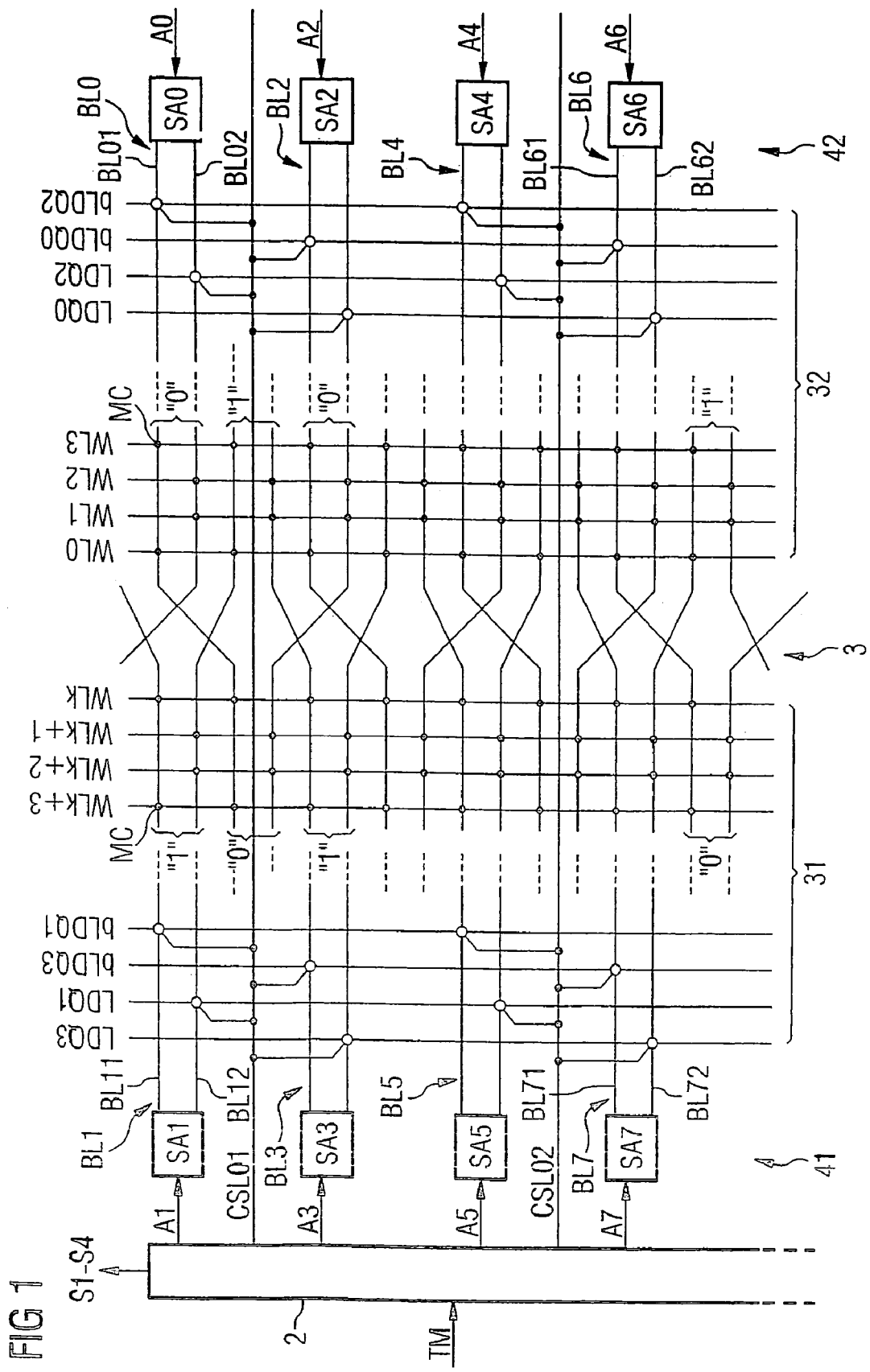
FIG. 1 shows a schematically illustrated embodiment of an integrated memory according to the invention.

FIG. 1 shows a schematic illustration of an embodiment of an integrated memory according to the invention. An exemplary memory cell array 1 having a plurality of word lines WL0 to WLk+3 and bit lines BL0 to BL7 is shown in this case. In this case, FIG. 1 shows an exemplary number of word lines and bit lines arranged within part of the memory cell array 1. In reality, a memory in the form of an SDRAM, for instance, has a plurality of word lines and bit lines that are arranged between two sense amplifier strips (designated by 41 and 42 in FIG. 1) in a partial region of the memory cell array that is delimited thereby. Furthermore, such a memory has a plurality of such demarcated partial regions and usually a number of identically constructed memory banks with respective memory cell arrays.

Situated in the memory cell array 1 in accordance with FIG. 1 are a number of memory cells MC arranged in matrix form along the word lines WL0 to WLk+3 and bit lines BL0 to BL7. The memory cells MC are arranged at crossover points of the word lines and bit lines and each comprise a storage capacitor and a selection transistor in the customary interconnection, which, however, are not illustrated in FIG. 1 for reasons of clarity. For selection of one of the memory cells, the respective selection transistor is turned on by an activated word line. As a result, the data signal of the selected memory cells along the word line can subsequently be evaluated and amplified by means of a sense amplifier, illustrated based on the sense amplifiers SA0 to SA7 in FIG. 1. Furthermore, the bit lines BL0 to BL7 are organized in bit line pairs in the embodiment in accordance with FIG. 1, it being possible for two bit lines of a bit line pair to be connected to a shared sense amplifier. For example, the bit lines BL01, BL02 form the bit line pair BL0 and are connected to the shared sense amplifier SA0.

Figure 2B:
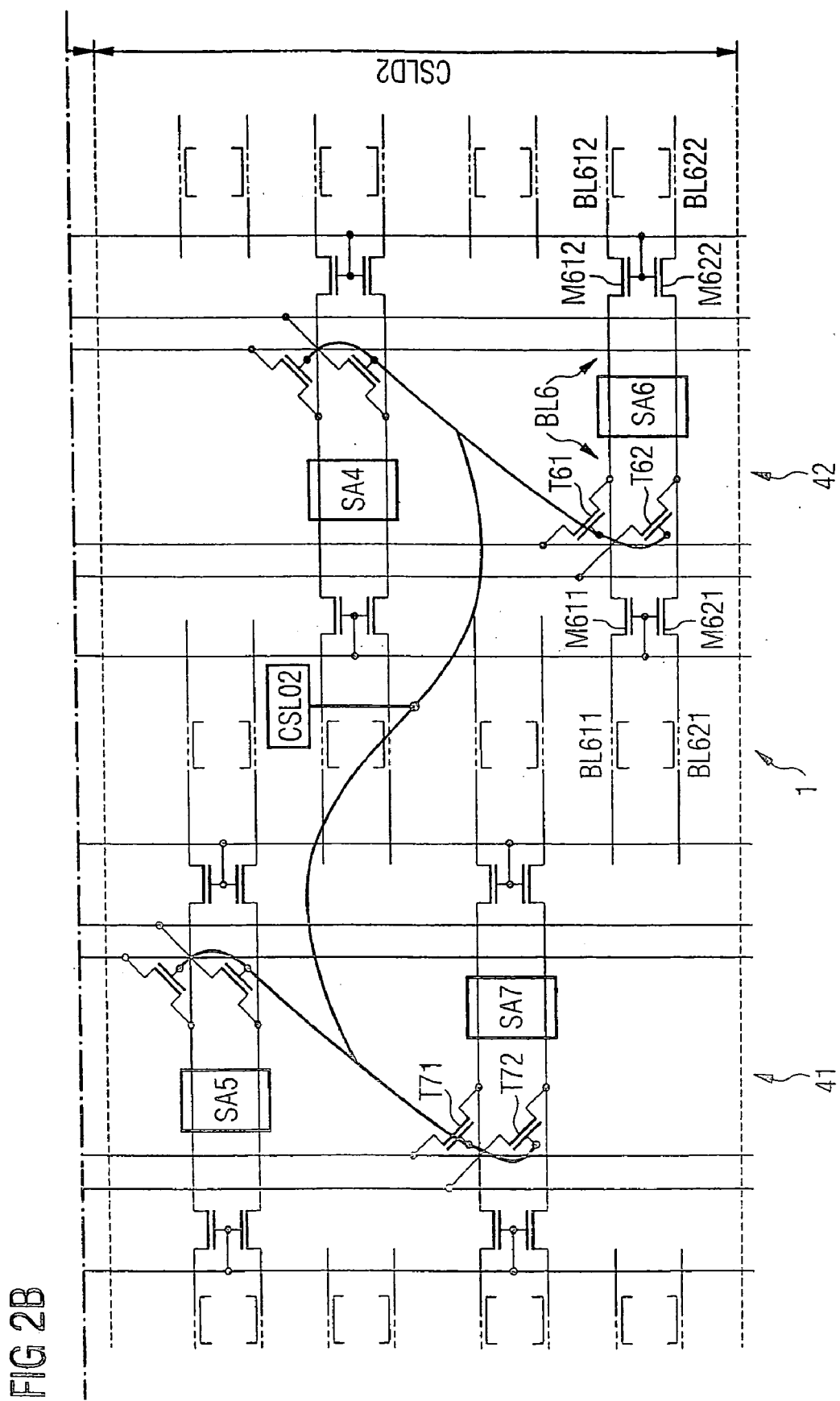

FIG. 1 and, as will be explained in more detail below, FIGS. 2A and 2B show a typical construction of an SDRAM memory chip in which the data lines from one of the bit lines as far as the secondary sense amplifier are generally organized hierarchically. The individual hierarchical stages of the data lines are connected to one another by respective multiplexer circuits. These multiplexer circuits are driven by respective parts of the address, for example, word line address and bit line address, in order to connect the respectively addressed partial region of a memory cell array to the corresponding secondary sense amplifier, which is not illustrated in FIGS. 1, 2A, and 2B. FIGS. 1, 2A, and 2B show the first hierarchical stage of the data lines of a memory cell array (also referred to as LDQ lines). In this case, the bit lines can be connected to a respective data line LDQi and bLDQi in each case via a switch T01 to T72 (FIG. 2). Analogously to the bit lines, the data lines LDQi and bLDQi are likewise organized in pairs and include the data lines LDQ0 to LDQ3 and bLDQ0 to bLDQ3.

Furthermore, the memory cell array 1 includes column select lines CSL01, CSL02. One of the column select lines CSL01, CSL02 is connected, in accordance with FIG. 2, to a plurality of the switches T01 to T72 at the control terminal thereof. If the column select lines CSL01, CSL02 are in an activated state, a corresponding number of bit lines BLi are in each connected to the same number of data lines LDQi and bLDQi.

The sense amplifiers SA0 to SA7 serve for evaluating and amplifying data signals of the memory cells MC and can be connected to corresponding bit lines BLi. In this case, the sense amplifiers SA1, SA3, SA5, SA7 are arranged in the sense amplifier strip 41 and the sense amplifiers SA0, SA2, SA4, SA6 are arranged in the sense amplifier strip 42. The data lines LDQ1, bLDQ1, LDQ3 and bLDQ3 are assigned to the sense amplifier strip 41, and the data lines LDQ0, bLDQ0, LDQ2 and bLDQ2 are assigned to the sense amplifier strip 42. In this case, the memory is organized such that the data lines LDQi, bLDQi assigned to a respective sense amplifier strip 41, 42 are connected to corresponding bit lines BLi by a column select line CSL01 and CSL02, respectively. The column select lines CSL01, CSL02 form the column select line domains CSLD1 and CSLD2, respectively, in this geometrical arrangement and driving. The connection of the column select lines CSL01, CSL02 to the switches T01 to T72 (which are indicated as circles) is only illustrated schematically in FIG. 1 for the sake of clarity.

As illustrated in greater detail with reference to FIGS. 2A and 2B, the bit lines BLi are subdivided into in each case two partial regions by the sense amplifier strips 41, 42. For example, the bit line pair BL1 is subdivided into a left-hand partial region (bit line pair BL1*l*) and a right-hand partial region (bit line pair BL1*r*) by the sense amplifier strip 41. The resulting bit lines BL111, BL121 and BL112, BL122, respectively, are connected to the sense amplifier SA1 in each case via an isolation switch M111, M121 and M112, M122, respectively. In accordance with FIGS. 2A and 2B, this also applies analogously to the rest of the bit lines BLi illustrated, the partial regions of which are connected to an assigned sense amplifier SAi of the corresponding sense amplifier strip in each case via an isolation switch Mi.

As illustrated in greater detail with reference to FIG. 1, the memory cell array 1 has a plurality of regions 31, 32 of the same type, which are separated from one another by a crossing location 3. At the crossing location 3, the bit lines BLi of the region 31 cross with the bit lines BLi of the region 32. The column select lines CSL01, CSL02 are connected to an access controller 2, which is put into a test operating mode by a test mode signal TM. The access controller 2 activates the column select lines CSL01, CSL02 in order to connect in each case a number of bit lines BLi to the corresponding data lines LDQi, bLDQi. Furthermore, by activation signals A0 to A7, the access controller 2 activates the sense amplifiers SA0 to SA7 driven by the respective activation signals for a memory cell access. The isolation switches Mi are put into the on state or turned off by the control signals S1 to S4.

A method for functional testing of the memory in accordance with FIGS. 1 and 2 is explained in more detail below. The embodiment of the method according to the invention described below accelerates a test cycle for functional testing of the memory cell by accelerating the writing of test data to the memory cells of the memory cell array.

In accordance with the present invention, both column select lines CSL01, CSL02 are activated, so that all the bit lines BLi illustrated in FIGS. 1, 2A, and 2B are connected to corresponding data lines LDQi, bLDQi via the switches T01 to T72 and receive an identical test datum. By means of the folded bit line concept and the regularly alternate distribution of the bit lines by way of the so-called bit line twists (crossing location 3), it is possible to produce different data topologies in the event of simultaneous activation of the column select line CSL01, CSL02. For example, a "0" is in each case applied on the data lines LDQ0/2, bLDQ0/2 assigned to the sense amplifier strip 42, and a "1" is in each case applied to the data lines LDQ1/3, bLDQ1/3 assigned to the sense amplifier strip 41. As long as the column select lines CSL01, CSL02 are not activated, the corresponding memory cells MC are in an undefined state. In order to be able to write such test data to all the memory cells MC, it is necessary for the word lines WLi illustrated to be activated simultaneously for the memory cell access by the access controller 2, i.e., multiple word line select mode. In order to be able to write to the respectively complementary bit lines BLi and data lines LDQi, bLDQi individually, it is necessary to deactivate the respective sense amplifiers SAi. Although the associated departure from the differential signal between mutually complementary lines leads to a slower read/write process, it is more than compensated for by the high degree of parallelism that can be achieved by activation of a plurality of column select lines.

It is also possible to produce any desired data topologies by a procedure in which not all the column select lines of the memory cell array are activated simultaneously, but rather, depending on the data pattern to be written in, for example, individual groups of column select lines in each case one after the other in order, for example, to successively write different test data to different regions of the memory cell array.

Effectiveness of writing to the memory cell array is improved in that, for example, in a further mode, the respectively left-hand and right-hand halves of a sense amplifier strip (for example, BL1l, BL1r of the sense amplifier strip 41) are relatively simultaneously connected to a corresponding sense amplifier of the sense amplifier strip and consequently to one another by the respective isolation transistor being turned on. The associated short-circuiting of the right-hand and left-hand half of a sense amplifier leads to a further shortening of a writing time of test data. Together with the driving of a plurality of sense amplifier strips, it is thus possible, in principle to write a test pattern to the entire memory chip in one access cycle. As illustrated with reference to FIGS. 1, 2A, and 2B, in each of the regions 31 and 32 of the same type in the memory cell array 1, both a plurality of column select lines CSL01, CSL02 and a plurality of word lines WLi are activated relatively simultaneously for a memory cell access.

In addition to the above-described fast writing of test data to the cell array, further useful analysis methods and quality assurance methods are also possible. For example, a group of word lines can be activated relatively simultaneously for a memory cell access. The group of word lines includes at least two of the word lines and at most a portion of the word lines. In another instance, a plurality of groups of word lines are activated individually one after the other relatively continuously across the memory cell array. For example, relatively simultaneous activation of two word lines, such as WL0 and WLi as an associated group, gives rise to a "vertical front" if a plurality of such groups are activated individually one after the other successively across the memory cell array.

For example, the group of word lines WL0, WL1 is activated first, and then the group of word lines WL2, WL3. As a result, a potential change is driven transversely across the memory cell array, whereby effects such crosstalk of "buried straps" of adjacent memory cells can be analyzed more easily. This also improves, for example, the possibility of examining threshold voltages of transistors and associated effects such as leakage currents below the threshold voltage, so that a better understanding of such leakage currents, for example, is possible. Furthermore, such a "vertical front" can generate a natural potential fluctuation of a plate voltage, the plate voltage being permanently present at the capacitance of the memory cell. Furthermore, it is possible to examine potential fluctuations at the well potential (back-bias), voltage fluctuations of the voltage of the selection transistors and voltage fluctuations of a precharge voltage. Consequently, the concept according to the invention affords advantages both with regard to the acceleration of a test cycle and a gain in flexibility in respect of the test coverage by flexible driving of word lines and column select lines in test operation.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
| --- | --- |
| 1 | Memory cell array |
| 2 | Access controller |
| 3 | Crossing location |
| 31, 32 | Memory region |
| 41, 42 | Sense amplifier strip |
| BL0 to BL7 | Bit lines |
| BL01 to BL72 | Bit lines |
| BL111 to BL622 | Bit lines |
| WL0 to WLk+3 | Word lines |
| T01 ro T72 | Switches |
| M111 to M622 | Isolation switches |
| CSL01, CSL02 | Column select lines |
| SA0 to SA7 | Sense amplifiers |
| A0 to A7 | Activation signal |
| TM | Test mode signal |
| S1 to S4 | Control signal |
| MC | Memory cells |
| CSLD1, CSDL2 | Column select line domains |
| BL1l, BL1r | Bit lines |

We claim:

1. An integrated memory, comprising:
   a plurality of memory cells arranged in a memory cell array along word lines for selection of the memory cells and bit lines for reading out or writing data signals of the memory cells;
   a plurality of switches, one of the bit lines being connected to a data line by a respective one of the switches;
   a plurality of column select lines, one of the column select lines being connected to a plurality of the switches for driving the switches in an activated state in order to connect a number of bit lines to a same number of data lines;
   an access controller being connected to the column select lines and operable in a test operating mode such that a plurality of the column select lines can be activated in the event of a memory cell access;
   a plurality of sense amplifiers for evaluating and amplifying the data signals of the memory cells, the sense amplifiers each being connected to a respective bit line and arranged in a sense amplifier strip that subdivides the bit lines into two partial regions; and
   a plurality of isolation switches for respectively coupling the partial regions of one of the bit lines to the sense amplifiers of the sense amplifier strip, the isolation switches being driven by the access controller such that the partial regions of one of the bit lines can be connected to a respective sense amplifier of the sense amplifier strip.

2. The integrated memory as claimed in claim 1, wherein the data lines are assigned to one of the sense amplifier strips, and the access controller is operable such that the data lines assigned to a sense amplifier strip are connected to corresponding bit lines by one of the column select lines.

3. The integrated memory as claimed in claim 1, wherein the memory cell array includes a plurality of regions of the same type, the integrated memory further comprising:
   a crossing location at which the bit lines of one of the regions of the memory cell array cross with the bit lines of another of the regions.

4. The integrated memory as claimed in claim 1, wherein the memory cell array includes a plurality of regions of the same type,
   the column select lines are provided in each of the regions of the memory cell array, and
   the access controller activates a plurality of the column select lines in one of the regions.

5. The integrated memory as claimed in claim 1, wherein the bit lines are organized in bit line pairs, two bit lines of a bit line pair being connected to a shared sense amplifier.

6. The integrated memory as claimed in claim 1, wherein the word lines are activated for a memory cell access by the access controller.

7. The integrated memory as claimed in claim 6, wherein the word lines are activated simultaneously.

8. The integrated memory as claimed in claim 1, wherein the partial regions of one of the bit lines are simultaneously connected to the respective sense amplifier.

9. A method for functional testing of an integrated memory including: a plurality of memory cells arranged in a memory cell array along word lines for selection of the memory cells and bit lines for reading out or writing data signals of the memory cells; a plurality of column select lines for driving a plurality of switches to respectively connect bits lines to data lines; an access controller operable in a test operating mode to activate the column select lines; a plurality of sense amplifiers respectively connected to bit lines and arranged in a sense amplifier strip that subdivides the bit lines into two partial regions; and a plurality of isolation switches for respectively coupling the partial regions of one of the bit lines to the sense amplifiers of the sense amplifier strip, the method comprising:
   simultaneously activating the plurality of the column select lines by the access controller in the event of a memory cell access; and
   driving the isolation switches by the access controller such that the partial regions of one of the bit lines are connected to a respective sense amplifier of the sense amplifier strip.

10. The method as claimed in claim 9, further comprising:
    simultaneously activating the word lines for a memory cell access by the access controller.

11. The method as claimed in claim 10, further comprising:
    simultaneously activating a group of the word lines by the access controller, the group including at least two of the word lines and at most a portion of the word lines; and
    simultaneously activating a plurality of groups of word lines individually one after the other across the memory cell array.

* * * * *

UNITED STATES PATENT AND TRADEMARK OFFICE
CERTIFICATE OF CORRECTION

PATENT NO. : 7,154,793 B2 Page 1 of 1
APPLICATION NO. : 10/948562
DATED : December 26, 2006
INVENTOR(S) : Michael Bernhard Sommer et al.

It is certified that error appears in the above-identified patent and that said Letters Patent is hereby corrected as shown below:

Col. 7, line 9, claim 1:   replace "colunm" with -- column --

Col. 8, line 20, claim 9:   replace "colunin" with -- column --

Signed and Sealed this

Twentieth Day of November, 2007

JON W. DUDAS
*Director of the United States Patent and Trademark Office*